United States Patent
Glenn

(10) Patent No.: US 7,592,536 B2
(45) Date of Patent: Sep. 22, 2009

(54) SOLAR CELL STRUCTURE WITH INTEGRATED DISCRETE BY-PASS DIODE

(75) Inventor: Gregory S. Glenn, Pacific Palisades, CA (US)

(73) Assignee: The Boeing Company, Chicago, IL (US)

( * ) Notice: Subject to any disclaimer, the term of this patent is extended or adjusted under 35 U.S.C. 154(b) by 1323 days.

(21) Appl. No.: 10/677,191

(22) Filed: Oct. 2, 2003

(65) Prior Publication Data

US 2005/0072457 A1 Apr. 7, 2005

(51) Int. Cl.
*H01L 31/00* (2006.01)
*H01L 31/042* (2006.01)

(52) U.S. Cl. .................. 136/244; 136/251; 136/252; 136/256; 136/259; 257/433

(58) Field of Classification Search .................. 136/246, 136/244, 255, 252, 251, 256, 259; 257/433, 257/461, 451
See application file for complete search history.

(56) References Cited

U.S. PATENT DOCUMENTS

| 4,481,378 A | | 11/1984 | Lesk | |
| 4,577,051 A | * | 3/1986 | Hartman | 136/244 |
| 4,997,491 A | * | 3/1991 | Hokuyo et al. | 136/255 |
| 5,330,583 A | | 7/1994 | Asai et al. | |
| 5,498,297 A | | 3/1996 | O'Neill et al. | |
| 5,616,185 A | | 4/1997 | Kukulka | |
| 5,800,630 A | * | 9/1998 | Vilela et al. | 136/249 |
| 6,313,396 B1 | * | 11/2001 | Glenn | 136/244 |
| 6,452,086 B1 | * | 9/2002 | Muller | 136/244 |

FOREIGN PATENT DOCUMENTS

| DE | 85 07 026 U1 | 6/1985 |
| EP | 0 121 095 A2 | 10/1984 |
| JP | 05 152596 A | 6/1993 |

\* cited by examiner

*Primary Examiner*—Nam X Nguyen
*Assistant Examiner*—Thanh-Truc Trinh
(74) *Attorney, Agent, or Firm*—McNees Wallace & Nurick, LLC

(57) ABSTRACT

A solar cell structure has a solar cell unit structure including a heat sink, and a solar cell having a front side, a back side, and a solar-cell projected area coverage on the heat sink. The solar cell has an active semiconductor structure that produces a voltage between the front side and the back side when the front side is illuminated. An intermediate structure is disposed between and joined to the back side of the solar cell and to the heat sink. The intermediate structure has an intermediate-structure projected area coverage on the heat sink and includes a by-pass diode having a diode projected area coverage on the heat sink. The diode projected area coverage on the heat sink may be substantially the same as the intermediate-structure projected coverage on the heat sink. Alternatively, the diode projected area coverage on the heat sink maybe less than the solar-cell projected area coverage on the heat sink, and the intermediate structure further includes a substrate coplanar with the by-pass diode.

21 Claims, 3 Drawing Sheets

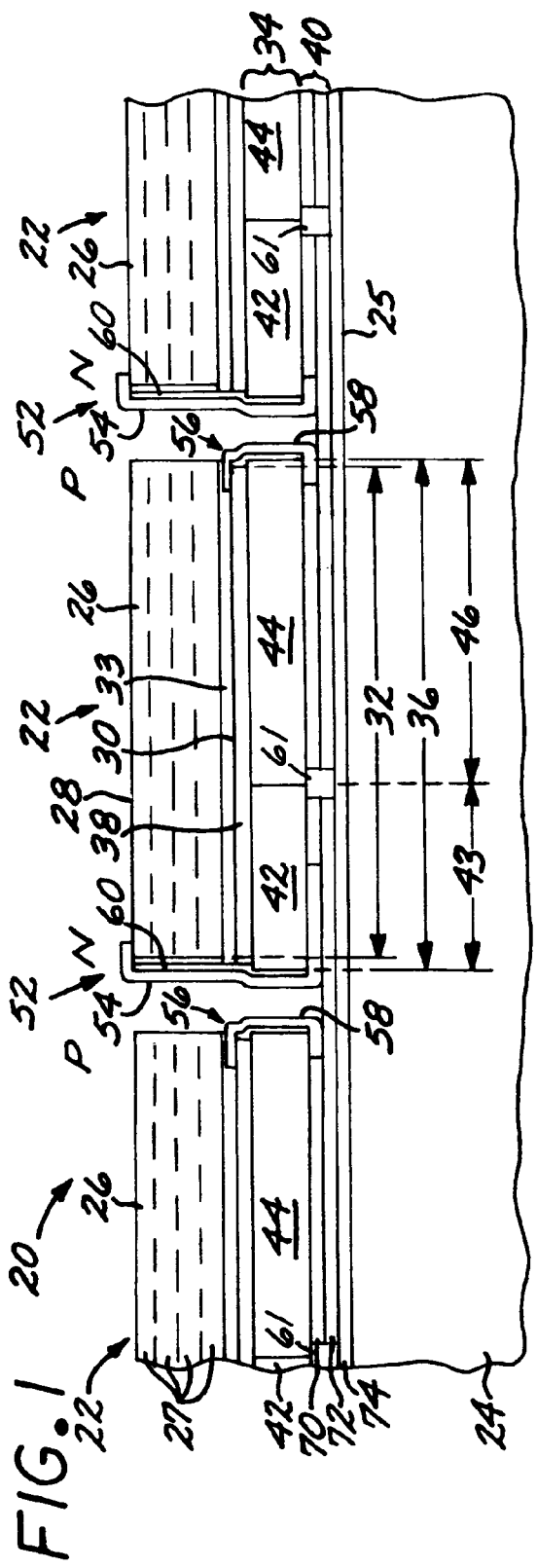
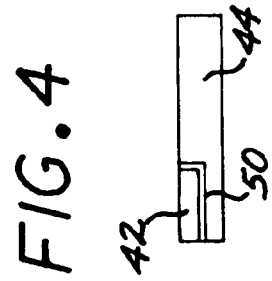
FIG. 4
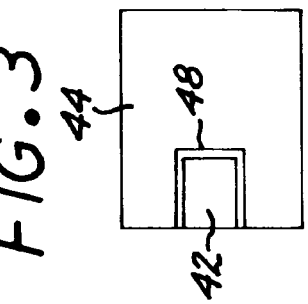
FIG. 3
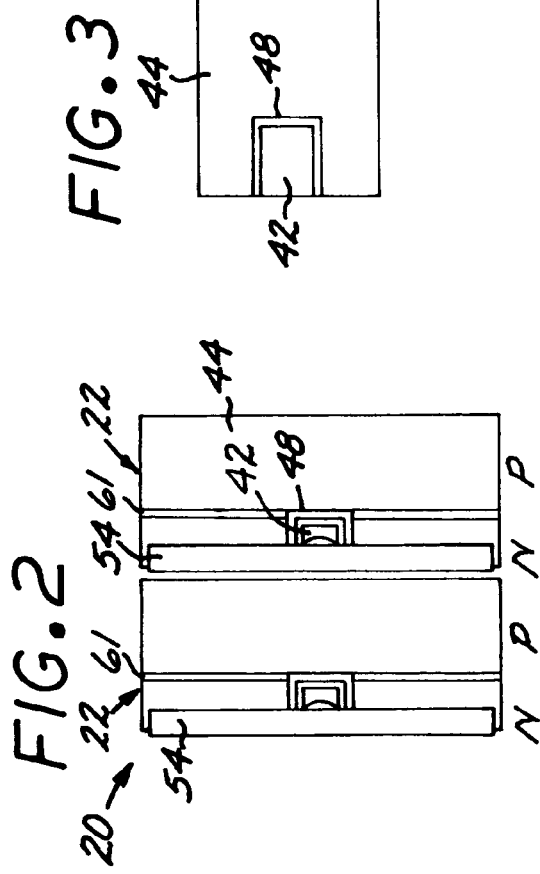
FIG. 2

SOLAR CELL STRUCTURE WITH INTEGRATED DISCRETE BY-PASS DIODE

This invention relates to solar cell structures and, more particularly, to a solar cell structure in which a discrete by-pass diode is integrated into the solar cell structure.

BACKGROUND OF THE INVENTION

A solar cell is formed of two (or more) semiconductor layers in facing contact with each other at a semiconductor junction. When illuminated by the sun or otherwise, the solar cell produces a voltage between the semiconductor layers. Advanced solar cells may include more than two semiconductor layers and their respective pairwise semiconductor junctions. The various pairs of semiconductor layers of the advanced solar cells are tuned to the various spectral components of the sun to maximize the power output of the solar cell.

The voltage and current output of the solar cell are limited by the materials of construction and the surface area of the solar cell. Most commonly, a number of solar cells are electrically interconnected in series and/or parallel arrays to form a solar cell structure that produces higher voltages and/or higher currents than are possible with the single solar cell. Such solar cell structures are now used in both space and terrestrial applications.

The solar cell structure works well when all of the solar cells are illuminated with about the same illumination intensity. However, if one of the solar cells of the solar cell structure is shaded while the others remain fully illuminated, the shaded solar cell is subjected to a reverse-bias condition by the continuing voltage and current output of the remaining solar cells.

Fortunately, each solar cell may be protected against the damage arising during the reverse-bias condition by a parallel diode that blocks current when the solar cell is not reverse biased, but passes the impressed current when the solar cell is reverse biased. The diode thus protects the individual cell against reverse-bias damage.

A number of diode configurations are in use and are operable, but each has its drawbacks. In one approach, the discrete by-pass diodes are placed to one side of the solar cells, necessitating the use of wiring that extends between the solar cell and the by-pass diodes. In another configuration, the discrete by-pass diode is bonded to the backside of the solar cell and interconnected to the semiconductor layers of the solar cell with leads. This approach potentially exposes the solar cell to stresses that may cause it to crack if pressure is applied against the by-pass diode during assembly bonding. In a variation, the by-pass diode is placed into a recess on the back side of the solar cell, but this approach is operable only for relatively thick solar cells. In another configuration, the diode is grown onto the front surface of the solar cell as part of the deposition process and then interconnected to the next cell in series. This approach is complex and causes assembly difficulties as well as reduced production yields and reduced solar cell efficiency. In yet another configuration, the diode is also grown into the front surface of the solar cell and interconnected with discrete or lithographic techniques. This approach is also complex, and has reduced production yields, and reduced solar cell efficiency.

Another problem experienced with solar cell structures is heat removal. For all solar cells, but particularly for concentrator solar cells, heat produced in the solar cell must be removed through the back side of the solar cell so that the solar cell does not exceed its preferred operating temperature for optimal performance. The presence of the by-pass diode must not interfere with the heat removal, and desirably the by-pass diode structure facilitates heat removal from the solar cell.

There is a need for an improved approach to the protection of solar cells against reverse-bias damage. Additionally, there is a need for an improved approach to removing heat from solar cells for improved performance and reliability. The present invention fulfills these needs, and further provides related advantages.

SUMMARY OF THE INVENTION

The present invention provides a solar cell structure comprising a solar cell protected against reverse-bias damage. The protection utilizes a discrete by-pass diode placed at the back side of the solar cell. The by-pass diode is or forms part of an intermediate structure that promotes heat transfer from the solar cell to a heat sink.

In accordance with the invention, a solar cell structure has a solar cell unit structure comprising a heat sink, and a solar cell having a front side, a back side that is preferably but not necessarily planar, and a solar-cell projected area coverage on the heat sink. The solar cell includes an active semiconductor structure that produces a voltage between the front side and the back side when the front side is illuminated. An intermediate structure is disposed between and joined to the back side of the solar cell and to the heat sink. The intermediate structure has an intermediate-structure projected area coverage on the heat sink and comprises a by-pass diode having a diode protected area coverage on the heat sink. Typically, there is additionally an intra-unit electrical connection structure operable to electrically interconnect the solar cell and the by-pass diode in an electrical anti-parallel relation.

In one form of this approach, the diode projected area coverage on the heat sink is less than the solar-cell projected area coverage on the heat sink, and the intermediate structure further comprises a substrate coplanar with the by-pass diode. Desirably, the diode projected area coverage on the heat sink and the substrate projected area coverage on the heat sink taken together are not less than the solar-cell projected area coverage on the heat sink. In one embodiment, the substrate has a substrate notch cut therefrom, and the by-pass diode is received into the substrate notch.

In another embodiment, the diode projected area coverage on the heat sink is not less than the solar-cell projected area coverage on the heat sink. In this embodiment, there typically is no other substrate in the intermediate structure, because the diode itself is the substrate that supports the solar cell. In yet another embodiment, the intermediate-structure projected area coverage on the heat sink is not less than the solar-cell projected area coverage on the heat sink.

In most instances, the solar cell structure has at least one additional solar cell unit structure as set forth above, and typically a plurality of solar cell unit structures as set forth above. In that case, there is a circuit electrical connection structure operable to electrically interconnect each of the solar cell unit structures in series.

The present approach incorporates both a discrete by-pass diode and a heat sink into the solar cell structure. The by-pass diode is placed in an intermediate structure at the rear of the solar cell between the solar cell and the heat sink. The by-pass diode does not obscure any portion of the front side of the solar cell from the sun and is connected to the solar cell by short leads. The by-pass diode may constitute only a small portion of the intermediate structure, with the remainder of the intermediate structure being a heat-conducting substrate.

This arrangement is normally used for non-concentrating or low-concentrating solar cell structures where the solar cells are relatively large in area. The by-pass diode may instead constitute substantially the entire intermediate structure, with no substrate present. The heat flow from the solar cell to the heat sink is therefore through only the by-pass diode, which is acceptable when a high-thermal-conductivity silicon by-pass diode is used. This arrangement is normally used for highly concentrating solar cells where the solar cell structure is at the focus of a concentrator and is relatively small in area, and where the by-pass diode is of about the same area as the solar cell.

The present approach provides a compact solar cell structure with both reverse-bias by-pass diode protection and a heat sink to aid in the removal of excess heat from the solar cell. Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 1 is a schematic side view of a first embodiment of a solar cell structure;

FIG. 2 is a schematic plan rear side view of a portion of the solar cell structure of FIG. 1;

FIG. 3 is a rear plan view of the by-pass diode received in a notch in the substrate;

FIG. 4 is a schematic side sectional view of the by-pass diode received in a pocket in the substrate;

DETAILED DESCRIPTION OF THE INVENTION

Figure 5:
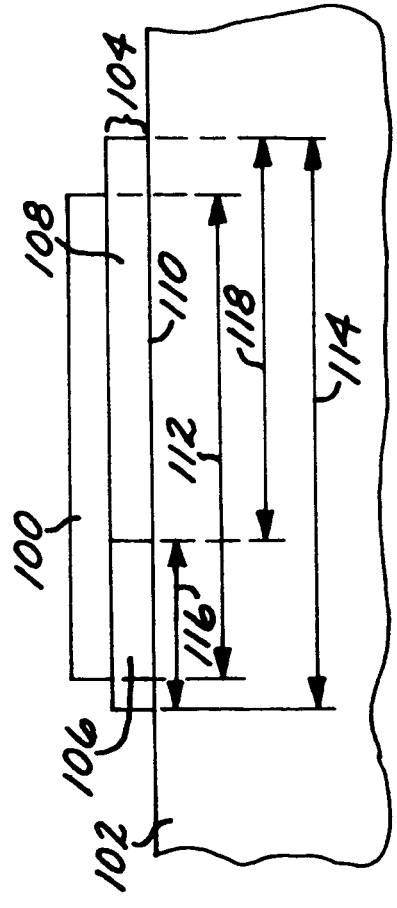
FIG. 5 is a schematic side view illustrating the meaning of projected area coverage.

FIGS. 1-2 depict a first embodiment of a solar cell structure 20. The solar cell structure 20 includes at least one, typically at least two, and in most cases a plurality of solar cell unit structures 22. Each solar cell unit structure 22 has a functional active semiconductor solar cell that produces a voltage between the front side and the back side when the front side is illuminated, but in most cases there are two or more of the solar cell unit structures 22 arranged in a series, parallel, or combined series/parallel array to produce the desired voltage and current outputs.

Each solar cell unit structure 22 includes a heat sink 24, and there may be (and usually are) more than one of the solar cell unit structures 22 on a single shared common heat sink 24, as illustrated. The heat sink 24 preferably has a substantially planar surface 25. The heat sink 24 is preferably made of a metal such as copper or aluminum, or a ceramic of good thermal conductivity such as aluminum nitride. There may optionally be a further heat-removal structure (not shown) to remove heat from the heat sink 24, such as a heat pipe, a solid thermal-conductor connection extending from the heat sink 24 to a radiator, or liquid cooling tubes or channels.

The solar cell unit structure 22 further includes a solar cell 26 having a front side 28, a back side 30, and a solar-cell projected area coverage 32 on the heat sink 24. The back side 30 of the solar cell 26 is preferably substantially planar, so that it fits well with the underlying structure and is also relatively easy to manufacture. The solar cell 26 is of any operable type and comprises an active semiconductor structure that produces a voltage between the front side 28 and the back side 30 when the front side 28 is illuminated by the sun or otherwise. There may be two, three, or more semiconductor layers 27, and in some cases as many as several dozen semiconductor layers 27, that form the solar cell 26. Four semiconductor layers 27, defining three junctions, are depicted in FIG. 1. Such solar cells 26 are known in the art. A back-side metallization 33 is deposited on the semiconductor layer 27 furthest from the front side 28 to define the back side 30 of the solar cell 26.

FIG. 5 illustrates in more detail what is meant by "projected area coverage". An element 100 is supported on an element 102 by an element 104, itself formed of two substantially coplanar elements 106 and 108. The "projected area coverage" of any of the elements 100, 104, 106, or 108 on the element 102 is the areal coverage in two dimensions of a surface 110 of the element 102 defined by perpendicular lines erected from the surface 110 of the element 102 to the peripheral extremities of the respective element 100, 104, 106, or 108. In FIG. 5, only one dimension (a linear length) of the projected area coverage is shown, but it is extended to two dimensions lying in the surface of the respective element when referencing the area. The element-100 projected area coverage of the element 102 is depicted as length 112; the element-104 projected area coverage of the element 102 is depicted as length 114; the element-106 projected area coverage of the element 102 is depicted as length 116; and the element-108 projected area coverage of the element 102 is depicted as length 118. These principles of defining projected area coverage are applicable to the embodiments of FIGS. 1, 6, and 7.

Returning to the discussion of FIGS. 1-2, an intermediate structure 34 is disposed between and joined to the back side 30 of the solar cell 26 by a high-thermal-conductivity joint 38, and to the surface 25 of the heat sink 24 by a high-thermal-conductivity 40. The high-thermal-conductivity joints 38 and 40 are typically either a metal such as a solder or braze metal, or a high-conductivity adhesive such as a metal-filled polymer adhesive, as illustrated for the joint 38, or a combination of a metal-filled polymer adhesive overlying a metallic trace, as illustrated for the joint 40. The illustrated joint 40 includes a layer 70 of a solder or a metal (e.g., silver)—filled adhesive contacting the intermediate structure 34, bonded to a metallic trace 72 deposited on a thin (e.g., 0.001 inch) dielectric (e.g., a polyimide such as Kapton™) layer 74 contacting and bonded to the surface 25 of the heat sink 24. The di-electric layer 74 can also be formed by depositing a non-conducting material, such as silicon nitride using chemical vapor deposition (CVD), and then depositing metal traces 72 on top of the dielectric layer 74. A gap 61 in the metallic trace 72 and solder joint 40 prevents shorting. The intermediate structure 34 has an intermediate-structure projected area coverage 36 on the heat sink 24.

The intermediate structure 34 includes a by-pass diode 42 having a diode projected area coverage 43 on the heat sink 24 that is (in this embodiment) less than the intermediate-structure projected area coverage 36 on the heat sink 24. The by-pass diode 42 is a conventional discrete thin diode, preferably a silicon diode. "Discrete" means that the diode is not integral with the solar cell and deposited with the solar cell 26. Instead, the diode is manufactured separately from the solar cell 26. An acceptable by-pass diode 42 is a p/n TD3136 diode made by MicroSemi Corp., although the invention is not so limited.

The intermediate structure 34 of this embodiment further includes a substrate 44 that is substantially coplanar with the by-pass diode 42 and is selected such that the intermediate structure 34 is of a substantially constant thickness that is equal to the thickness of the by-pass diode 42, measured in the direction perpendicular to the surface 25 of the heat sink 24. That is, the by-pass diode 42 and the substrate 44 taken together constitute the intermediate structure 34 of substantially constant, uniform thickness. The substrate 44 has a substrate projected area coverage 46 on the heat sink 24. Desirably, the diode projected area coverage 43 on the heat sink 24 and the substrate projected area coverage 46 on the heat sink 24 taken together (which is equal to the intermediate-structure projected area coverage 36) are not less than the solar-cell projected area coverage 32 on the heat sink 24. That is, the lateral extent of the by-pass diode 42 and the substrate 44 taken together is at least as great as the lateral extent of the solar cell 26. However, in other cases the by-pass diode 42 and the substrate 44 taken together may be smaller than the lateral extent of the solar cell 26.

The material of construction of the substrate 44 is selected to have a relatively high thermal conductivity, and to have its coefficient of thermal expansion over the temperature range experienced during operation exactly or at least closely matched to that of the solar cell 26. The solar cell 26 typically has a relatively low coefficient of thermal expansion, and therefore the material of construction of the substrate 44 is preferably a low coefficient of thermal expansion metal such as Kovar™ or Invar™ or the like, a ceramic having a relatively high thermal conductivity such as aluminum oxide or aluminum nitride, or silicon that is not doped.

In one form of the embodiment of FIG. 1, the by-pass diode 42 is positioned within a notch 48 in the substrate 44 as illustrated in FIG. 3. The by-pass diode 42 and the substrate 44 are preferably of about the same thickness. In a typical case, the substrate 44 is about 0.015 inch thick and the by-pass diode is about 0.014 inch thick. An acceptable by-pass diode 42 for this embodiment is a Schottky diode, such as P/N SC1705030 made by International Rectifier, although the invention is not so limited. The by-pass diode may instead be substantially thinner than the substrate 44, so that the by-pass diode 42 is positioned within a pocket 50 in the substrate as illustrated in FIG. 4. In a typical case of this embodiment the by-pass diode 42 is about 0.0075 inch thick. An acceptable by-pass diode 42 for this embodiment is a p/n TD3136 diode made by MicroSemi Corp., although the invention is not so limited. The notched substrate or pocketed substrate may be made either by shaping the substrate during its initial production (e.g., in the green tape process for ceramic substrates) or by forming the substrate without the notch or pocket and then forming the notch or pocket by a process which is appropriate for the selected substrate, such as by chemical etching, by laser machining, or by mechanical abrasion (e.g., sand blasting).

An intra-unit electrical connection structure 52 is operable to electrically interconnect the solar cell 26 and the by-pass diode 42 in an electrical anti-parallel relation. In the illustrated embodiment, the electrically conductive joints 38 and 40 provide both the structural interconnection between the solar cell 26, the intermediate structure 34, and the heat sink 24, and also a portion of the intra-unit electrical interconnection structure 52. A wraparound metal tab 54, extending around the edge of the solar cell unit structure 22 from the front side 28 of the solar cell 26 to the trace 72 of the joint 40, provides the remainder of the intra-unit electrical connection structure 52. A thin layer of electrical insulation 60, preferably in the form of a polyimide (e.g., Kapton™) film, may be applied to the tab 54 to prevent undesired electrical shorting of the tab 54 with the semiconductor layers 27 and with the back side 30 of the solar cell 26.

Each solar cell unit structure 22 produces a relatively small voltage and current output. To provide a greater voltage as required to operate typical electrical devices that are powered by the solar cell structure 20 or to charge batteries, the solar cell structure 20 includes at least one additional solar cell unit structure 22 as described herein. The solar cell structure 20 having two-or-more series-connected solar cell unit structures 22 also includes a circuit electrical connection structure 56 operable to electrically interconnect each of the solar cell unit structures 22 in series. In a typical case, this circuit electrical connection structure 56 includes a wraparound metal tab 58 extending from the back side 30 on one of the solar cell unit structures 22 to the metallic trace 72 of the bottom joint 40 of the next adjacent solar cell unit structure, as seen in FIG. 1.

Figure 6:
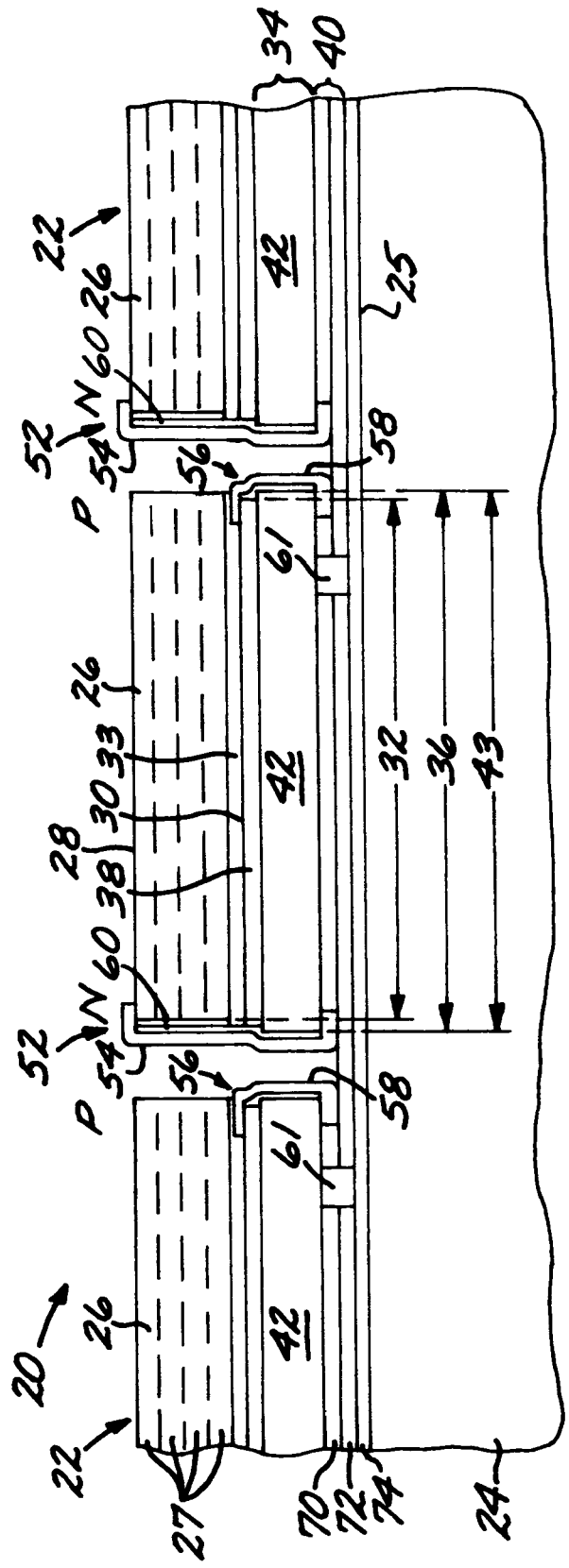
FIG. 6 is a schematic side view of a second embodiment of a solar cell structure.

Another embodiment of the solar cell structure 20 is illustrated in FIG. 6. Features common with the embodiments of FIGS. 1-4 are assigned the same reference numerals in FIG. 6, and the prior discussion is incorporated. Other features compatible between the embodiments may be utilized in the embodiment of FIG. 6.

The approach of FIG. 6 differs in that the diode projected area coverage 43 on the heat sink 24 is substantially the same as the intermediate-structure projected area coverage 36 on the heat sink 24. That is, there is no substrate in the embodiment of FIG. 6, and the by-pass diode 42 forms the entire intermediate structure 34. Desirably, the intermediate-structure projected area coverage 36 on the heat sink 24 is not less than the solar-cell projected area coverage 32 on the heat sink 24. In this embodiment, the entire lateral area between the solar cell 26 and the heat sink 24 is the by-pass diode 42. This embodiment is typically used where the lateral (surface) area of the solar cell 26 is relatively small, as where the solar cell 26 is used in a concentrator solar cell structure having mirrors and/or lenses that concentrate incident sunlight to a high flux upon a relatively small area of solar cells located at about the focus of the mirrors and/or lenses. Such solar cells are of about the same lateral surface area as typical thin by-pass diodes.

Figure 7:
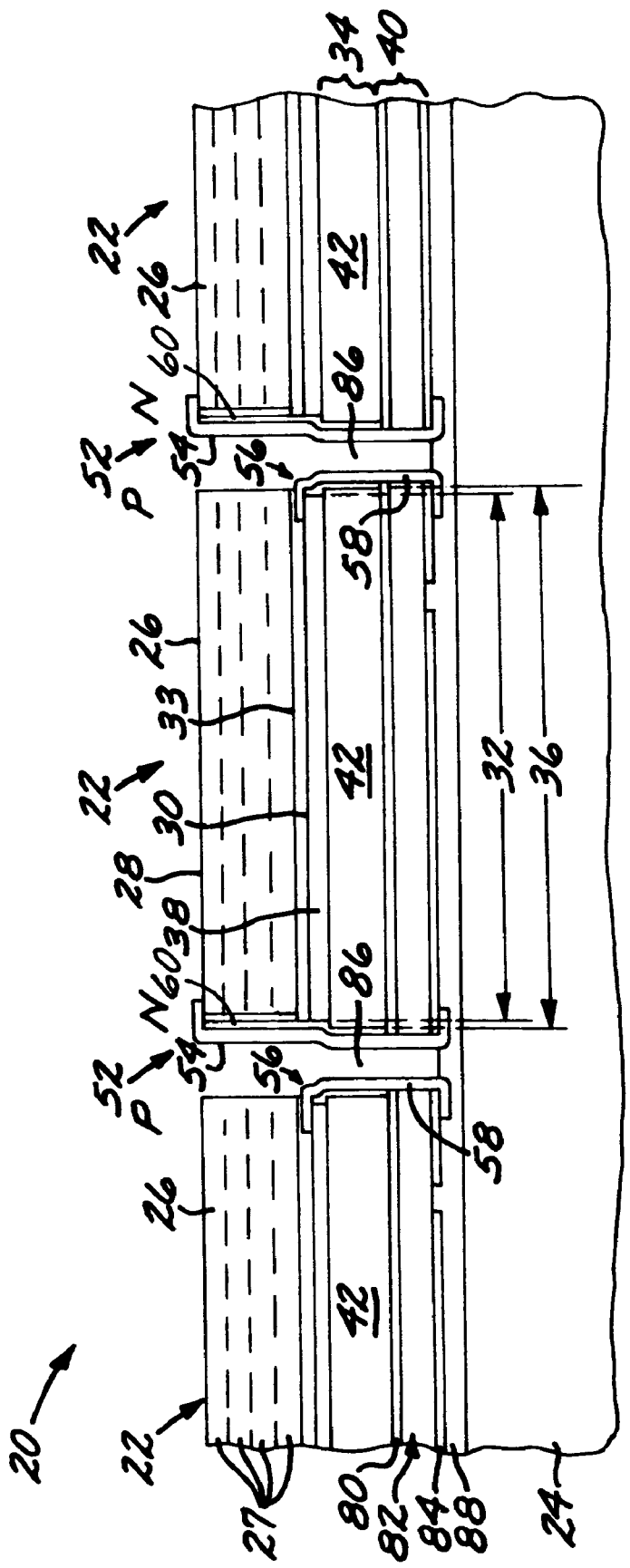
FIG. 7 is a schematic side view of a third embodiment of a solar cell structure.

Another embodiment of the solar cell structure 20 is illustrated in FIG. 7. Features common with the other embodiments are assigned the same reference numerals in FIG. 7, and their discussion is incorporated. Other features compatible between the embodiments may be utilized in the embodiment of FIG. 7. The embodiment of FIG. 7 is illustrated without a substrate, similar to the embodiment of FIG. 6, but it may be used with a substrate 44 in the manner of the embodiment of FIG. 1.

In the embodiment of FIG. 7, the by-pass diode 42 is soldered to a metal trace 80 on a thermally conductive PC (printed circuit) board 82 such as made by CoolPoly. A typical material of construction of the body of the PC board is CoolPoly D2, which is a thermally conductive liquid crystalline polymer (LCP) with a thermal conductivity of about 15 watts/meter-K. The negative contact tabs 54 of one solar cell 26 and the positive contact tabs 56 of an adjacent solar cell 26 are interconnected, typically by soldering, to a metal trace 84 on the rear side of the PC board 82 through vias 86 in the PC board 82. The PC board 82 is attached to the heat sink 24 with a layer 88 of a thermally conductive and electrically insulating adhesive. The PC board 82 thus functions as part of the electrical interconnection and also as the joint 40.

The present invention has been reduced to practice in the embodiment of FIGS. 1-3 using a Schottky barrier bypass diode 42. The substrate 44 was Kovar™ about 0.007 inch thick. The joints 38 and 40 were reflow soldered. Silver-loaded epoxy adhesive has also been successfully tested for use in the joints 38 and 40.

The solar cell structures 20 as described herein provide both reverse-bias by-pass diode protection for each solar cell, and also a high rate of heat flow from the solar cell 26, through the intermediate structure 34, and into the heat sink 24. The solar cell structures 20 are smooth on their back surfaces, without a diode protruding from the back surfaces that may lead to cracking of the structure in service. The front side of the solar cell is not obscured by any structure other than current-collecting traces and the tabs 54.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A solar cell structure having a solar cell unit structure comprising:
    a heat sink;
    a solar cell having a front side, a back side, and a solar-cell projected area coverage on the heat sink, wherein the solar cell comprises an active semiconductor structure that produces a voltage between the front side and the back side when the front side is illuminated, wherein the solar cell includes a back-side metallization at the back side; and
    an intermediate structure disposed between and joined to the back-side metallization of the solar cell and to the heat sink, and having an intermediate-structure projected area coverage on the heat sink, wherein the intermediate structure comprises
        a by-pass diode having a diode projected area coverage on the heat sink.

2. The solar cell structure of claim 1, wherein the by-pass diode is a discrete by-pass diode.

3. The solar cell structure of claim 1, wherein the diode projected area coverage on the heat sink is less than the solar-cell projected area coverage on the heat sink, and wherein the intermediate structure further comprises
    a substrate coplanar with the by-pass diode.

4. The solar cell structure of claim 1, wherein the diode projected area coverage on the heat sink is less than the solar-cell projected area coverage on the heat sink, and wherein the intermediate structure further comprises
    a substrate coplanar with the by-pass diode and having a substrate projected area coverage on the heat sink such that the diode projected area coverage on the heat sink and the substrate projected area coverage on the heat sink taken together are not less than the solar-cell projected area coverage on the heat sink.

5. The solar cell structure of claim 1, wherein the diode projected area coverage on the heat sink is less than the solar-cell projected area coverage on the heat sink, wherein the intermediate structure further comprises a substrate coplanar with the by-pass diode, and wherein the substrate has a substrate notch cut therefrom, and wherein the by-pass diode is received into the substrate notch.

6. The solar cell structure of claim 1, wherein the intermediate-structure projected area coverage on the heat sink is not less than the solar-cell projected area coverage on the heat sink.

7. The solar cell structure of claim 1, further including
    an intra-unit electrical connection structure operable to electrically interconnect the solar cell and the by-pass diode in an electrical anti-parallel relation.

8. The solar cell structure of claim 1, wherein the back side of the solar cell is substantially planar.

9. The solar cell structure of claim 1, wherein the solar cell structure includes at least one additional solar cell unit structure as set forth in claim 1, and further including
    a circuit electrical connection structure operable to electrically interconnect each of the solar cell unit structures in series.

10. The solar cell structure of claim 1, wherein the solar cell structure includes a joint between the intermediate structure and the heat sink, and wherein the joint comprises a metallic trace deposited upon a dielectric layer.

11. The solar cell structure of claim 1, wherein the solar cell structure includes a joint between the intermediate structure and the heat sink, and wherein the joint comprises a PC board having a metal trace on a face thereof.

12. A solar cell structure having a solar cell unit structure comprising:
    a heat sink;
    a solar cell having a front side, a back side, and a solar-cell projected area coverage on the heat sink, wherein the solar cell comprises an active semiconductor structure that produces a voltage between the front side and the back side when the front side is illuminated, wherein the solar cell includes a back-side metallization at the back side;
    an intermediate structure disposed between and joined to the back-side metallization of the solar cell and to the heat sink and having an intermediate-structure projected area coverage on the heat sink, wherein the intermediate structure comprises
        a discrete by-pass diode having a diode projected area coverage on the heat sink that is less than the intermediate-structure projected area coverage on the heat sink, and
        a substrate coplanar with the by-pass diode and having a substrate projected area coverage on the heat sink such that the diode projected area coverage on the heat sink and the substrate projected area coverage on the heat sink taken together are not less than the solar-cell projected area coverage on the heat sink; and
    an intra-unit electrical connection structure operable to electrically interconnect the solar cell and the by-pass diode in an electrical anti-parallel relation.

13. The solar cell structure of claim 12, wherein the back side of the solar cell is substantially planar.

14. The solar cell structure of claim 12, wherein the solar cell structure includes at least one additional solar cell unit structure as set forth in claim 12, and further including
    a circuit electrical connection structure operable to electrically interconnect each of the solar cell unit structures in series.

15. The solar cell structure of claim 12, wherein the solar cell structure includes a joint between the intermediate structure and the heat sink, and wherein the joint comprises a metallic trace deposited upon a dielectric layer.

16. The solar cell structure of claim 12, wherein the solar cell structure includes a joint between the intermediate structure and the heat sink, and wherein the joint comprises a PC board having a metal trace on a face thereof.

17. A solar cell structure having
    at least two solar cell unit structures, each solar cell unit structure comprising:

a heat sink, a solar cell having a front side, a back side, and a solar-cell projected area coverage on the heat sink, wherein the solar cell comprises an active semiconductor structure that produces a voltage between the front side and the back side when the front side is illuminated, wherein the solar cell includes a back-side metallization at the back side, an intermediate structure disposed between and joined to the back-side metallization of the solar cell and to the heat sink and having an intermediate-structure projected area coverage on the heat sink, wherein the intermediate structure comprises a by-pass diode having a diode projected area coverage on the heat sink that is substantially the same as the intermediate-structure projected area coverage on the heat sink, and an intra-unit electrical connection structure operable to electrically interconnect the solar cell and the by-pass diode in an electrical anti-parallel relation; and a circuit electrical connection structure operable to electrically interconnect each of the solar cell unit structures in series.

18. The solar cell structure of claim 17, wherein the intermediate-structure projected area coverage on the heat sink is not less than the solar-cell projected area coverage on the heat sink.

19. The solar cell structure of claim 17, wherein the back side of the solar cell is substantially planar.

20. The solar cell structure of claim 17, wherein the solar cell structure includes a joint between the intermediate structure and the heat sink, wherein the joint comprises a metallic trace deposited upon a dielectric layer, and wherein the circuit electrical connection structure is accomplished in part through the metallic trace.

21. The solar cell structure of claim 17, wherein the solar cell structure includes a joint between the intermediate structure and the heat sink, wherein the joint comprises a PC board having a metal trace on a face thereof, and wherein the circuit electrical connection structure is accomplished in part through the metallic trace.

* * * * *

UNITED STATES PATENT AND TRADEMARK OFFICE
CERTIFICATE OF CORRECTION

PATENT NO. : 7,592,536 B2  Page 1 of 1
APPLICATION NO. : 10/677191
DATED : September 22, 2009
INVENTOR(S) : Gregory S. Glenn It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1819 days.

Signed and Sealed this

Twenty-first Day of September, 2010

David J. Kappos
*Director of the United States Patent and Trademark Office*